(12) United States Patent
Ha et al.

(10) Patent No.: US 10,236,702 B2
(45) Date of Patent: Mar. 19, 2019

(54) METHOD AND APPARATUS FOR RAPIDLY CHARGING BATTERY

(71) Applicant: LG CHEM, LTD., Seoul (KR)

(72) Inventors: Jeong-Ho Ha, Daejeon (KR); Hyo-Mi Kim, Daejeon (KR); Hyeok-Moo Lee, Daejeon (KR); Song-Taek Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/517,039

(22) PCT Filed: Aug. 13, 2015

(86) PCT No.: PCT/KR2015/008496
§ 371 (c)(1),
(2) Date: Apr. 5, 2017

(87) PCT Pub. No.: WO2016/068463
PCT Pub. Date: May 6, 2016

(65) Prior Publication Data
US 2017/0310137 A1    Oct. 26, 2017

(30) Foreign Application Priority Data

Oct. 30, 2014 (KR) .................. 10-2014-0149420
Aug. 3, 2015 (KR) .................. 10-2015-0109510

(51) Int. Cl.
*H02J 7/00* (2006.01)
*G01R 31/36* (2019.01)
*H02J 7/04* (2006.01)

(52) U.S. Cl.
CPC ........ *H02J 7/0057* (2013.01); *G01R 31/3648* (2013.01); *H02J 7/045* (2013.01);
(Continued)

(58) Field of Classification Search
CPC ....... Y02E 60/12; H02J 7/0042; H02J 7/0045; H01M 10/46; H01M 10/44
(Continued)

(56) References Cited

U.S. PATENT DOCUMENTS 5,596,259 A * 1/1997 Mino ............... H01M 10/44
320/157
6,104,165 A    8/2000 Miyamoto et al.
(Continued)

FOREIGN PATENT DOCUMENTS

JP    11-97074 A    4/1999
JP    2005-185060 A    7/2005
(Continued)

OTHER PUBLICATIONS

International Search Report issued in PCT/KR2015/008496 (PCT/ISA/210), dated Nov. 27, 2015.

*Primary Examiner* — Arun C Williams
(74) *Attorney, Agent, or Firm* — Birch, Stewart, Kolasch & Birch, LLP

(57) ABSTRACT

Provided are a method and an apparatus for rapidly charging a battery, such that a battery can be rapidly charged while having an extended lifetime. The method for charging a battery according to the present invention charges a battery by starting from an initial charging rate higher than 1 C, while stepwise decreasing the charging rate, such that a negative electrode potential of the battery does not drop to a level less than or equal to 0V. An occurrence of Li-plating of a negative electrode of the battery can be prevented by the criteria for preventing the negative electrode potential from dropping to a level less than or equal to 0V, thereby providing an effect of rapidly charging the battery while extending the lifetime of the battery.

9 Claims, 4 Drawing Sheets

(52) U.S. Cl.
CPC ........... *H02J 7/0073* (2013.01); *H02J 7/0075* (2013.01); *H02J 2007/0096* (2013.01)

(58) Field of Classification Search
USPC ........................................................ 320/107
See application file for complete search history.

(56) References Cited

U.S. PATENT DOCUMENTS

| | | | |
|---|---|---|---|
| 9,397,516 B2 | 7/2016 | Hunter et al. | |
| 2001/0000212 A1* | 4/2001 | Reipur | G01R 31/3613 320/104 |
| 2001/0041604 A1* | 11/2001 | Ogasawara | H02J 7/0068 455/573 |
| 2001/0051300 A1* | 12/2001 | Moriguchi | H01M 4/587 429/231.8 |
| 2003/0117112 A1* | 6/2003 | Chen | H02J 7/0073 320/137 |
| 2003/0160592 A1* | 8/2003 | Murakami | H02J 7/0013 320/116 |
| 2004/0195996 A1* | 10/2004 | Nishida | H02J 7/0073 320/103 |
| 2006/0176025 A1* | 8/2006 | Mori | H02J 7/0073 320/134 |
| 2010/0327810 A1* | 12/2010 | Jimbo | B60W 10/26 320/126 |
| 2014/0062415 A1 | 3/2014 | Barsukov et al. | |

FOREIGN PATENT DOCUMENTS

| | | |
|---|---|---|
| JP | 2010-218900 A | 9/2010 |
| JP | 2012-49040 A | 3/2012 |
| JP | 2012-221788 A | 11/2012 |
| JP | 2013-19852 A | 1/2013 |
| KR | 10-2010-0065557 A | 6/2010 |
| KR | 10-2013-0080518 A | 7/2013 |
| KR | 10-2014-0025310 A | 3/2014 |
| KR | 10-2014-0096797 A | 8/2014 |

\* cited by examiner

METHOD AND APPARATUS FOR RAPIDLY CHARGING BATTERY

TECHNICAL FIELD

The present disclosure relates to a battery charging method and apparatus, and more particularly, to a fast battery charging method and apparatus using stepwise reduction in charging rate to charge batteries quickly and extend the battery life.

The present application claims priority to Korean Patent Application No. 10-2014-0149420 filed in the Republic of Korea on Oct. 30, 2014 and Korean Patent Application No. 10-2015-0109510 filed in the Republic of Korea on Aug. 3, 2015, the disclosures of which are incorporated herein by reference.

BACKGROUND ART

Recently, there is dramatically growing demand for portable electronic products such as laptop computers and mobile phones, and with the increasing demand for electric carts, electric wheelchairs and electric bikes, many studies are being made on high performance battery that can be recharged repeatedly. Furthermore, with the gradual depletion of carbon energy and the increasing interest in environment in recent years, the demand for hybrid electric vehicle (HEV) and electric vehicle (EV) is gradually increasing all over the world.

Accordingly, more interests and studies are intensively made on automobile batteries that are an essential component of HEVs or EVs, and further, there is an urgent need for development of fast charging technology to charge batteries fast. Particularly, fast charging is very important performance to EVs having no extra energy source.

A battery charging process includes allowing an electric current to flow in batteries so that electric charge and energy accumulates, and this process should be carefully controlled. Generally, an excessive charging rate (C-rate) or charging voltage degrades the battery performance eternally, and eventually, may cause a total failure or an abrupt accident such as leakage of a chemical material highly susceptible to corrosion or an explosion.

A conventional battery charging method includes a constant current (CC) method which charges with a uniform current from start to end, a constant voltage (CV) method which charges with a uniform voltage from start to end, and a constant current-constant voltage (CC-CV) method which charges with a uniform current at the start of charging and charges with a uniform voltage at the end of charging.

In the CC method, a high current flows due to a big voltage difference at the start of charging. From the viewpoint of fast charging, the higher the charging current is, the better, but continuous charging with a high current reduces the charging efficiency and affects the battery life. Furthermore, in the CC charging method, a current such as that of the start of charging still flows in batteries continuously after charging finishes, causing Li-plating that forms a metal plating film according to the properties of lithium ion, inducing safety issues such as a loss of an overcharge control function. For this reason, batteries should be separated from chargers immediately when charging finishes, causing inconvenience.

Furthermore, the CV method has a disadvantage; it is difficult to preset a constant voltage value due to a significant change in terminal voltage caused by temperature changes and heat generated from batteries when charging finishes, and as batteries are generally charged with 15.5~16V for 20~24 hours, a long charging time is inconvenience.

The CC-CV method is most commonly used. This method charges batteries with CC when the batteries are so much discharged, and shifts to CV at the point in time when charging nearly finishes, to prevent overcharging. Where "C" is battery capacity in A·h that is a unit of charge (often indicated by Q), an electric current in ampere that is a unit of current is selected as a fraction (or multiplier) of C. Generally, charging is performed at a maximum of 1 C. For lithium batteries with capacity of 700 mAh, it takes approximately 1.5 hours to charge the batteries. However, this charging method needs to charge under a suitable condition for the charging capacity of chargers at the place where ventilation is good and the normal temperature is about 25° C.

Disadvantages of the aforementioned conventional battery charging protocols are that when batteries are slowly charged or overcharge occurs in batteries, electrode plate of the batteries is damaged, reducing the battery life. Conventionally, studies have been primarily made to achieve fast charging by improving the battery performance such as output.

DISCLOSURE

Technical Problem

The present disclosure is directed to providing a battery charging method and apparatus for charging batteries fast and increasing battery life.

Technical Solution

To achieve the objective, a battery charging method according to the present disclosure charges a battery, starting from an initial charging rate (C-rate) higher than 1 C and reducing the charging rate in a stepwise manner to prevent a negative electrode potential of the battery from dropping down to 0V or less.

The initial charging rate may be from 1.5 C to 5 C. The initial charging rate may be from 1.5 C to 3 C.

A battery charging method according to the present disclosure includes a step for acquiring data by measuring a negative electrode potential of a battery as a function of State of Charge (SOC) at each of different charging rates, a step for obtaining a protocol from the acquired data, wherein the protocol changes a charging rate in a stepwise manner to prevent the negative electrode potential of the battery from dropping down to 0V or less, and a step for charging the battery according to the protocol.

The charging rate at the data acquisition step may be in a range of 0.25 C~5 C. The charging rate at the data acquisition step may be in a range of 0.25 C~3 C. The charging rate at the data acquisition step may be in a range of 0.25 C~1.5 C. The protocol may include stepwise decreasing charging rates (consequential charging current) and charging voltage information after charging completion at each charging rate.

A battery charging apparatus according to the present disclosure includes a power source unit configured to output a charging voltage inputted from a normal power source, and a battery charging unit configured to output the charging voltage inputted from the power source unit to a battery as a charging current to charge the battery, and when the charging voltage of the battery reaches a preset step, to change the charging current so that the charging current outputted to the battery is controlled to stepwise change, wherein the battery charging unit charges the battery with the charging current that is controlled stepwise according to the protocol that changes the charging rate in a stepwise manner to prevent the negative electrode potential of the battery from dropping down to 0V or less.

Advantageous Effects

According to the present disclosure, batteries are charged with the charging current controlled stepwise according to the protocol that changes the charging rate in a stepwise manner to prevent the negative electrode potential from dropping down to 0V or less. The occurrence of Li-plating in negative electrodes of batteries can be prevented by the standard for prevention of negative electrode potential drop to 0V or less, consequently increasing the battery life and achieving fast battery charging.

BRIEF DESCRIPTION OF THE DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawings.

BEST MODE FOR CARRYING OUT THE INVENTION

Hereinafter, preferred embodiments of the present disclosure will be described in detail with reference to the accompanying drawings. However, the present disclosure is not limited to the embodiments disclosed below, and will be embodied in a variety of different forms, and this embodiment is only provided for complete disclosure of the present disclosure and to help those skilled in the art understand the scope of the invention fully and completely.

The most problematic issue of fast charging in a constant current mode is deterioration of a cell caused by Li-plating on the surface of a negative electrode. Li-plating is more apt to occur with the increasing charging current density (charging rate or charging current) and the decreasing temperature, and to prevent it, if the charging current density is lowered, a target charging speed is not arrived at. The present disclosure can provide technology for shortening the charging time while preventing the occurrence of Li-plating in batteries.

When the negative electrode potential is 0V or less, Li-plating occurs. Thus, the present disclosure measures the negative electrode potential as a function of charging current through a 3 electrode-cell test, and when charging with each current through it, quantifies numerically a charging limit where Li-plating does not occur. Furthermore, through it, multi-step charging technique to prevent the occurrence of Li-plating and reduce the charging time is provided by charging batteries while reducing the charging current in a stepwise manner and controlling the charging rate to prevent the negative electrode potential from dropping down to 0V or less.

Figure 1:
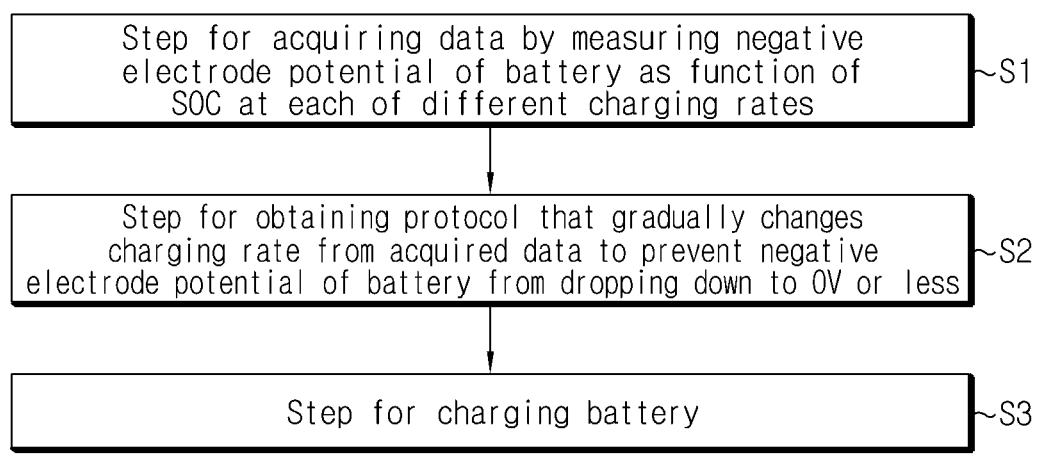
FIG. 1 is a flowchart of a battery charging method according to the present disclosure.

FIG. 1 is a flowchart of a battery charging method according to the present disclosure.

Referring to FIG. 1, step for acquiring data by measuring a negative electrode potential of a battery as a function of SOC at each of different charging rates is performed (s1).

For example, the negative electrode potential is measured as a function of charging current through a 3 electrode-cell test. Where "C" is the battery capacity in A·h a unit of charge (often indicated by Q), an electric current in ampere is selected as a fraction (or multiplier) of C. For example, a charging rate of 1 C is a charging/discharging speed at which the capacity of the fully charged battery is drained or filled in 1 hour, and is also known as a current density at that time. Recently, with the diversity of functions of electronic devices, an amount of current required for the devices to use within a predetermined period of time is increasing in large increments. Accordingly, batteries serving as their energy source need much higher performance. In the case of mobile phones, most of them needed a charging rate and a discharging rate of C/2 in the past, but in the future, these functions will be further enhanced, requiring performance fit for a charging rate and a discharging rate of 1 C. Currently, batteries for laptop computers, EVs and PHEVs require a similar charging rate and a much higher discharging rate.

The charging rate higher than 1 C is desirable from the viewpoint of fast charging. However, continuous charging with high current is accompanied by high temperature heat generation inside the battery, and each electrode may be under overvoltage condition due to the resistance of the battery. Accordingly, the charging rate should be set in consideration of the type and properties of battery.

The charging rate range at the data acquisition step relies on the type and properties of battery. For example, batteries for EVs may acquire data in the charging rate range of 0.25 C~1.5 C with the initial charging rate set to 1.5 C. As another example, batteries for PHEVs (plug-in hybrid electric vehicle) may acquire data in the charging rate range of 0.25 C~3 C with the initial charging rate set to 3 C. The initial charging rate and the charging rate range may be restricted by the type of battery as well as the maximum current of a motor used in a real vehicle.

As mentioned previously, in consideration of the properties of battery, batteries for EVs may set the initial charging rate to 1.5 C, and batteries for PHEVs may set the initial charging rate to 3 C. Depending on the battery specification requiring a much faster charging rate and discharging rate, the initial charging rate may be increased, for example, up to 5 C. Accordingly, the initial charging rate may be from 1.5 C to 5 C, and in the present disclosure, the charging rate range at the data acquisition step may be in the range of 0.25 C~5 C.

As mentioned previously, more interests and studies are intensively made on automobile batteries that are an essential component of HEVs or EVs, and further, there is an urgent need for development of fast charging technology to charge batteries fast. There is a gradually growing request for charging time in the automobile market, and to meet the request, a higher initial charging rate is needed. From the viewpoint of fast charging, a higher initial charging rate is advantageous, but due to the problem pointed out previously, when the charging rate is too high, each electrode is likely to be under overvoltage condition because of resistance of batteries. Furthermore, if the charging rate is too high, the limit (in the case of the present disclosure, a negative electrode potential of 0V or less) is reached at the same time as the start of charging, failing to significantly shorten the total charging time. Accordingly, to increase the initial charging rate, enhancement of the resistance properties of batteries should be attained together. The present disclosure can increase the initial charging rate to 5 C for batteries with enhanced resistance properties than traditional batteries.

Figure 2:
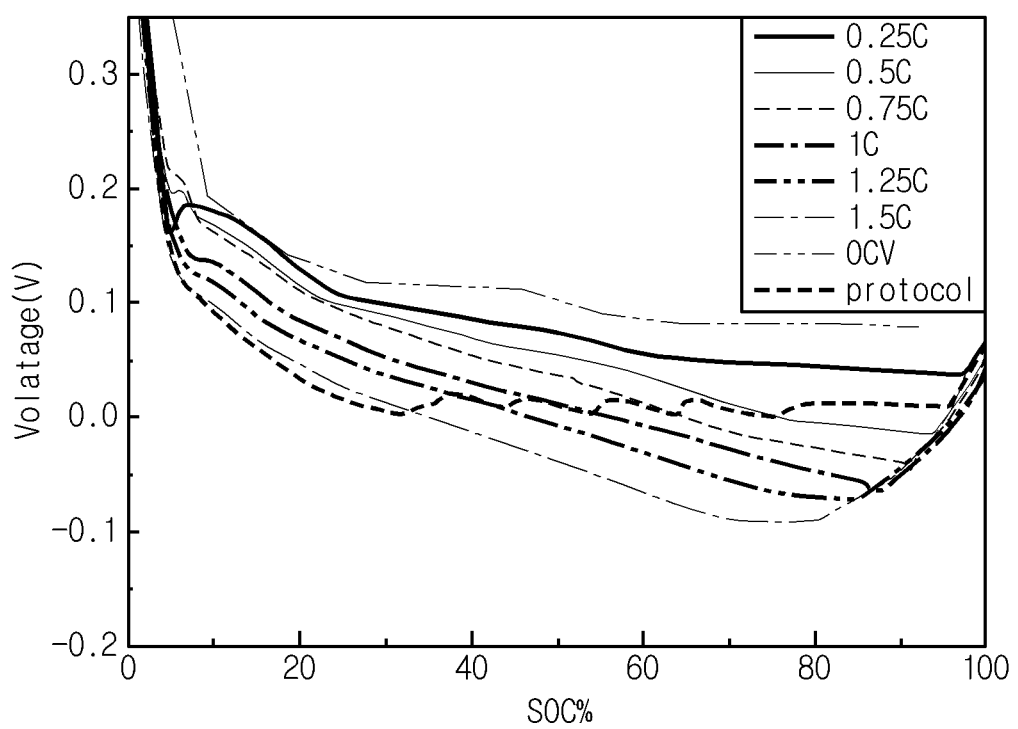
FIG. 2 shows a negative electrode potential as a function of charging rate and a negative electrode potential during protocol-based charging on the basis of it.

FIG. 2 shows a negative electrode potential as a function of charging rate. As shown in FIG. 2, a graph can be obtained by measuring a negative electrode potential as a function of SOC at varying charging rates from 1.5 C to 0.25 C.

Subsequently, a protocol that changes the charging rate in a stepwise manner to prevent the negative electrode potential of batteries from dropping down to 0V or less is obtained from the acquired data (s2). If drop of the negative electrode potential down to 0V or less is prevented, an ion layer formed during charging of batteries diffuses into an electrolyte and decomposes, preventing Li-plating from occurring in the negative electrode.

For example, in FIG. 2, a protocol that prevents the negative electrode potential from dropping down to 0V or less as indicated by a dotted line can be obtained. Charging begins with the initial charging rate of 1.5 C, and the negative electrode potential becomes 0V at the point where SOC is 35%. The charging rate is then changed to a next charging rate, 1.25 C. During charging, the negative electrode potential becomes 0V at the point where SOC is 47%. The charging rate is then changed to a next charging rate, 1 C. During charging, the negative electrode potential becomes 0V at the point where SOC is 56%. The charging rate is then changed to a next charging rate, 0.75 C. During charging, the negative electrode potential becomes 0V at the point where SOC is 65%. The charging rate is then changed to a next charging rate, 0.5 C. During charging, the negative electrode potential becomes 0V at the point where SOC is 76%. The charging rate is then changed to a next charging rate.

The protocol can be obtained by this method, and the graph of negative electrode potential vs SOC changes depending on battery type, but this method for obtaining a protocol may be similarly applied.

Furthermore, although this embodiment describes that the charging rate reduces from 1.5 C to 0.25 C by 0.25 C, the initial charging rate range and the charging rate range at the data acquisition step may change to any extent as mentioned previously, and an amount by which the charging rate reduces may be any value other than 0.25 C. As the amount of reduction is lessened, the step is subdivided, increasing the total charging time, but the Li-plating prevention effect is improved.

Figure 3:
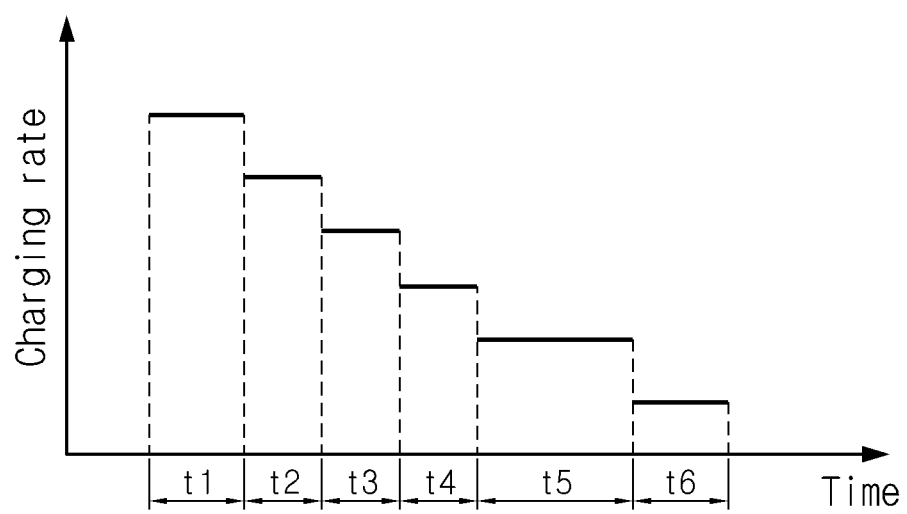
FIG. 3 is a graph showing a charging rate (charging current) over time when charging a battery by a method according to the present disclosure.

FIG. 3 is a graph showing a charging rate (charging current) over time when charging batteries by the method of the present disclosure, and represents a protocol (in case that a final charging rate is 0.4 C, not 0.25 C) similar to the protocol shown in FIG. 2 in the form of a charging rate over time.

The charging current of a charger for charging batteries reduces stepwise from the initial charging rate corresponding to 1.5 C to the final charging rate over time. As described previously, because the charging rate is for preventing the negative electrode potential from dropping down to 0V or less, the time (t1 to t6) during which each charging rate is maintained may change. As described above, the present disclosure measures the negative electrode potential as a function of charging rate, and when charging with each current through this, quantifies numerically the charging limit where Li-plating does not occur.

Subsequently, batteries are charged according to the protocol (s3). The protocol may include stepwise decreasing charging rates and charging voltage information after completion of charging at each charging rate. According to the present disclosure, batteries are charged by applying a charging current optimized in accordance with the protocol.

The charging protocol can be realized using the battery charging apparatus according to the present disclosure. The battery charging apparatus includes a power source unit configured to output charging voltage inputted from a normal power source; and a battery charging unit configured to output the charging voltage inputted from the power source unit to a battery as a charging current to charge the battery, and when the charging voltage of the battery reaches a preset step, to change the charging current so that the charging current outputted to the battery is controlled to change in a stepwise manner. The battery charging unit charges the battery with the charging current that is controlled stepwise according to a protocol that changes the charging rate in a stepwise manner to prevent the negative electrode potential of the battery from dropping down to 0V or less.

The logic of the protocol of the charging method according to the present disclosure is incorporated into the battery charging apparatus and can be used to charge batteries. The battery charging unit employs a processor for achieving fast charging. According to an embodiment of the present disclosure, the processor stores the logic of the charging protocol in memory, and voltage and current may be measured with high accuracy to achieve accurate control and preserve the apparatus performance.

Table 1 summarizes the charging voltage and the charging time when actually charging according to a charging protocol set based on the negative electrode potential for each current density without dropping the negative electrode potential down to 0V or less.

TABLE 1

| C-rate | SOC/voltage at anode = 0 V | Charging time (min) |
| --- | --- | --- |
| 1.5 C | SOC35 | 14 |
| | 3.823 V | |
| 1.25 C | SOC47 | 5.76 |
| | 3.832 V | |
| 1.0 C | SOC56 | 5.4 |
| | 3.84 V | |
| 0.75 C | SOC65 | 7.2 |
| | 3.857 V | |
| 0.5 C | SOC76 | 13.2 |
| | 3.95 V | |
| 0.4 C | SOC80 | 6 |
| | 4.0 V | |
| Charging time for 80% SOC | | 51.56 min |

When the battery is charged at the initial charging rate of 1.5 C, it takes 14 minutes (t1) to reach the point at which SOC is 35%, i.e., the charging voltage of the battery is 3.823V. When the battery is charged at the charging rate changed to a next charging rate 1.25 C according to the protocol, the point at which SOC is 47% is reached, and in this instance, the charging voltage of the battery is 3.832V, and 5.76 minutes (t2) are spent. When the battery is charged at the charging rate changed to a next charging rate 1 C according to the protocol for 5.4 minutes (t3), the point at which SOC is 56% is reached, and in this instance, the charging voltage of the battery is 3.84V. When the battery is charged at the charging rate changed to a next charging rate 0.75 C according to the protocol, the point at which SOC is 65% is reached, and in this instance, the charging voltage of the battery is 3.857V, and the maintenance time of this step is 7.2 minutes (t4). When the battery is charged at the charging rate changed to a next charging rate 0.5 C according to the protocol for 13.2 minutes (t5), the point at which SOC is 76% is reached, and in this instance, the charging voltage of the battery is 3.95V. When the battery is charged at the charging rate changed to a next charging rate 0.4 C according to the protocol, the point at which SOC is 80% is reached, and this instance, the charging voltage of the battery is 4.0V, and 6 minutes (t6) are spent at this step.

As can be seen from Table 1, execution according to the teaching of the present disclosure induces a charging profile in which 80% (80% SOC) of full charge is obtained in 51.56 minutes (t1+t2+t3+t4+t5+t6), resulted in reduced charging time; even in the case of full charge, the charging time is shorter than about 1.5 hours taken to fully charge at the charging rate of 1 C according to the conventional method.

Furthermore, according to the present disclosure, because the charging process is controlled to prevent the negative electrode potential from dropping down to 0V or less, when comparing to a general CC-CV charging method, there is no risk that Li-plating occurs in the negative electrode, and as a consequence, there is a life extension effect.

The life of battery is a measure of the time during which the battery can be used and its unit is cycle, and it is said to be a cycle characteristic. That is, it indicates how many times the battery can be recharged during use, and in a sense of electrical energy, when the battery is charged just once and is used up until the battery is fully discharged, it is called 1 cycle, and the number of cycles is called life.

Figure 4:
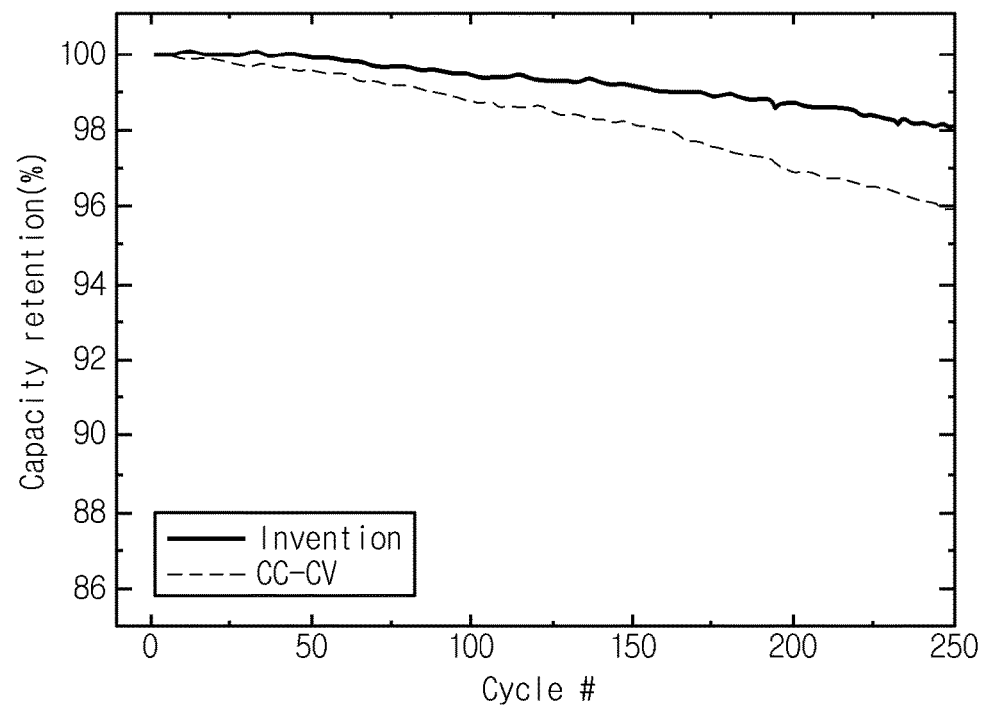
FIG. 4 is a battery life comparison graph of a charging method using stepwise reduction in charging current according to the present disclosure and a conventional CC-CV charging method.

FIG. 4 is a battery life comparison graph of the charging method using stepwise charging current decrease according to the present disclosure and the conventional CC-CV charging method, showing changes in capacity vs the number of cycles. It is necessary that the battery capacity does not reduce and is maintained even after a long charging/discharging cycle.

In the present disclosure and the conventional art, charging was performed for the same time and discharging was performed under the same condition (1 C CC), and the life of each case was compared. In the case of the conventional method as shown in FIG. 4, the capacity retention reduces to about 96% after 250 cycles, while in the case of the present disclosure, the capacity retention is 98% or higher even after 250 cycles.

The battery life is determined by many factors, and structural stability of the electrode, especially, stability of the negative electrode, is important. An ideal negative electrode has high reaction reversibility with lithium ions. When an ideal reversible reaction takes place, there is no change in capacity retention as a function of cycles. It can be seen that the charging method using stepwise charging current decrease according to the present disclosure has higher reaction reversibility than the conventional method, which results from Li-plating prevention at the negative electrode. As described above, according to the charging method of the present disclosure using stepwise charging current decrease, it can be seen that the life is longer than conventional by preventing the deterioration of batteries.

The charging method using stepwise charging current decrease according to the present disclosure charges batteries rapidly using an initial charging rate higher than 1 C at the stepwise decreasing charging rate to prevent the negative electrode potential from dropping down to 0V or less, achieving fast battery charging without occurrence of Li-plating. It is possible to prevent damage to the internal structure of batteries, and increasing the battery life.

While the preferred embodiments of the present disclosure have been hereinabove illustrated and described, the present disclosure is not limited to the above particular preferred embodiments, and it is obvious to those skilled in the art that various modifications may be made thereto without departing from the essence of the present disclosure claimed in the appended claims and such modifications fall within the scope of the claims.

What is claimed is:

1. A battery charging method which charges a battery, comprising:
    charging at a rate of 1.5 C until the SOC of the battery reaches 35%; then
    charging at a rate of 1.25 C until the SOC of the battery reaches 47%; and then
    charging at a rate of 1 C until the SOC of the battery reaches 56%,
    wherein in each of the charging steps, a negative electrode potential of the battery is prevented from dropping down to 0V or less.

2. The battery charging method according to claim 1, wherein each subsequent step charging is performed after the negative electrode potential of the battery substantially reaches 0V.

3. A battery charging method, comprising:
    a step for acquiring data by measuring a negative electrode potential of a battery as a function of SOC at each of different charging rates;
    a step for obtaining a protocol from the acquired data, wherein the protocol changes a charging rate in a stepwise manner to prevent the negative electrode potential of the battery from dropping down to 0V or less; and
    a step for charging the battery according to the protocol, wherein the step for acquiring data further comprises measuring the negative electrode potential as a function of charging current through a 3 electrode-cell test.

4. The battery charging method according to claim 3, wherein the charging rate at the data acquisition step is in a range of 0.25 C~5 C.

5. The battery charging method according to claim 4, wherein the protocol has an initial charging rate higher than 1 C.

6. The battery charging method according to claim 5, wherein the protocol has an initial charging rate of from 1.5 C to 5 C.

7. The battery charging method according to claim 3, wherein the protocol includes stepwise decreasing charging rates according to the SOC and charging voltage information after charging completion at each charging rate.

8. The battery charging method according to claim 3, wherein the data acquisition step comprises measuring the negative electrode potential while reducing the charging rate by 0.25 C.

9. A battery charging apparatus, comprising:
    a power source unit configured to output a charging voltage inputted from a normal power source; and
    a battery charging unit configured to output the charging voltage inputted from the power source unit to a battery as a charging current to charge the battery, and when the charging voltage of the battery reaches a preset step, to change the charging current so that the charging current outputted to the battery is controlled to change in a stepwise manner, wherein the battery charging unit charges the battery with the charging current that is controlled stepwise according to a protocol that changes the charging rate in a stepwise manner to prevent the negative electrode potential of the battery from dropping down to 0V or less, wherein the protocol is obtained by:

a step for acquiring data by measuring a negative electrode potential of the battery as a function of SOC at each of different charging rates; and a step for obtaining a protocol from the acquired data, wherein the protocol changes a charging rate in a stepwise manner to prevent the negative electrode potential of the battery from dropping down to 0V or less, and wherein the step for acquiring data further comprises measuring the negative electrode potential as a function of charging current through a 3 electrode-cell test.

\* \* \* \* \*